(12) United States Patent
Naraki et al.

(10) Patent No.: US 6,479,832 B1
(45) Date of Patent: Nov. 12, 2002

(54) SURFACE HEIGHT DETECTING APPARATUS AND EXPOSURE APPARATUS USING THE SAME

(75) Inventors: Tsuyoshi Naraki, Tokyo (JP); Kazuhiko Hori, Kanagawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/267,682

(22) Filed: Mar. 15, 1999

Related U.S. Application Data

(63) Continuation of application No. 08/892,107, filed on Jul. 14, 1997, now abandoned.

(30) Foreign Application Priority Data

Jul. 22, 1996 (JP) .............................................. 8-210635

(51) Int. Cl.$^7$ ............................................. G01N 21/86
(52) U.S. Cl. .............................. 250/559.3; 250/559.29; 250/548
(58) Field of Search .......................... 250/201.2, 201.5, 250/201.4, 548, 559.29, 559.3, 559.4, 559.27; 356/630, 601, 609, 610, 509, 510, 511, 516

(56) References Cited

U.S. PATENT DOCUMENTS

| | | | |
|---|---|---|---|
| 4,558,949 A | * 12/1985 | Uehara et al. | 356/152 |
| 4,650,983 A | 3/1987 | Suwa | 250/205 |
| 5,218,415 A | 6/1993 | Kawashima | 250/559.3 |
| 5,502,311 A | 3/1996 | Imai et al. | 250/557 |
| 5,587,794 A | 12/1996 | Mizutani et al. | 250/548 |
| 5,744,814 A | 4/1998 | Uchiyama | 250/559.4 |

* cited by examiner

Primary Examiner—Que T. Le
(74) Attorney, Agent, or Firm—Nixon & Vanderhye P.C.

(57) ABSTRACT

An illumination device emits detection light toward the surface of a substrate from an oblique direction with respect to the substrate. The detection light is shaped into a slit beam by an optical shaper. An alteration device changes the width of the slit beam by controlling the optical shaper. The slit beam strikes the surface of the substrate through an optical element. The slit beam reflected from the surface of the substrate is oscillated along the width direction of the slit by a controlled oscillation mirror. A detector detects the surface height of the substrate based on the oscillating slit beam.

43 Claims, 6 Drawing Sheets

SURFACE HEIGHT DETECTING APPARATUS AND EXPOSURE APPARATUS USING THE SAME

This application is a continuation of application Ser. No. 08/892,107, filed Jul. 14, 1997, now abandoned.

BACKGROUND OF THE INVENTION

This invention relates to a technique for detecting a surface height of a substrate and, more particularly, to an apparatus for detecting a surface height of a photosensitive substrate used in an exposure apparatus.

In an exposure apparatus used for manufacturing a semiconductor device or a liquid crystal display device, a pattern formed on a mask is transferred onto a photosensitive substrate under image-forming conditions that must be satisfactory. A current exposure apparatus typically uses an auto-focus mechanism to measure the height of the photosensitive substrate, that is, the position of the surface of the photosensitive substrate along the optical axis direction of the projection optical system. The stage on which the photosensitive substrate is loaded is moved by a driving system along the optical axis of the projection optical system to bring the surface of the photosensitive substrate into a focal point of the projection optical system. A known auto-focus mechanism emits a slit-like light beam (referred to as a slit beam) from an oblique direction with respect to the photosensitive substrate and detects the light beam reflected from the surface of the photosensitive substrate. When the surface height of the photosensitive substrate changes, the reflecting direction of the light beam from the surface of the photosensitive substrate also changes. The auto-focus mechanism utilizes this principle to detect the height of the photosensitive substrate surface.

FIG. 6 illustrates the reflecting state of a slit-like detection beam (slit beam) emitted by the auto-focus mechanism. The detection beam is guided to a glass plate 100, which is used for fabricating a liquid crystal display device. Because the glass plate 100 is transparent, a portion of the incident light beam is reflected by the top surface of the glass plate 100, which becomes a first reflected light beam R1. Another portion of the incident light beam passes through the top surface and is reflected by the bottom of the glass plate 100, which becomes a second reflected light beam R2. To detect the Z position (height) of the glass plate 100, the first reflected light beam R1 from the top surface must be sufficiently separated from the second reflected light beam R2 from the bottom surface. In other words, only the first light beam R1 reflected from the top surface must be accurately detected. To this end, the width of the slit beam is narrowed so that the second reflected light beam R2 from the bottom surface is not mixed with the first reflected light beam R1 from the top surface of the glass plate 100.

In recent years, various substrates with different thicknesses have been used in an exposure apparatus. If a substrate is thin, then a third light beam R3, which is reflected from the bottom surface of the thin substrate indicated by the dashed line, gets closer to the first light beam R1, which is reflected from the top surface thereof, as is illustrated by the dashed arrow. In this situation, the width of the slit beam must be further narrowed in order to completely separate the first light beam R1 reflected from the top surface from the third light beam R3 reflected from the bottom surface.

By narrowing the width of the slit beam, the first reflected light beam R1 from the top surface can be reliably separated from the second (or third) reflected light beam R2 (R3) from the bottom surface even if the thickness of the substrate is small. However, as the width of the slit beam is reduced, the dynamic range of a detection signal (focusing signal) detected through, for example, synchronous demodulation also becomes narrow. With a narrow dynamic range, if the surface of the substrate is positioned considerably offset from the target (or ideal) position, the height of the substrate surface cannot be detected because it is positioned out of a detectable range. If this is the case, a so-called search operation must be performed for bringing the substrate surface within a detectable range of the auto-focus system while adjusting the height of the substrate. The search operation takes time to detect the height of the substrate surface, which causes the throughput of the exposure apparatus to drop.

SUMMARY OF THE INVENTION

This invention was conceived in view of the problems in the conventional technique, and it is an object of the invention to provide a surface height detecting apparatus that is capable of measuring the substrate surface height reliably and quickly and to provide an exposure apparatus using the height detecting apparatus.

To achieve the above and other objects, in one aspect of the invention, a surface height detecting apparatus has an illumination device for emitting detection light toward the surface of a substrate from an oblique direction with respect to the surface of the substrate. The profile of the detection light is shaped by an optical shaper into a slit-like profile, thereby generating a slit beam. An alteration device alters the width of the slit beam by controlling the optical shaper. A control oscillation mirror guides the slit beam onto the surface of the substrate, and vibrates the light beam reflected from the surface of the substrate in a direction parallel to the width of the slit to generate an oscillating slit beam. A detector detects the surface height of the substrate based on the oscillating slit beam.

The alteration device alters the width of the slit beam according to the thickness of the substrate. For example, as the thickness of the substrate becomes larger, the alteration device increases the width of the slit beam along the optical axis. The alteration device also increases the width of the slit beam when roughly detecting the surface height of the surface, and decreases the width of the slit beam when precisely detecting the surface height of the substrate. The width of the slit beam may also be adjusted according to the material of the substrate.

The surface height detector preferably includes a slit plate, which is positioned at an image-forming spot of the slit beam that was reflected by the surface of the substrate, and an amplitude controller for controlling the amplitude of the slit beam according to the width of the slit beam altered by the alteration device. The detector detects the height of the surface of the substrate based on the slit beam that has passed through the slit plate.

In another aspect of the invention, an exposure apparatus is provided that emits an exposure light beam to a mask on which a predetermined pattern is formed and transfers an image of the pattern through a projection optical system onto a photosensitive substrate surface. The exposure apparatus includes an illumination device for emitting detection light toward the surface of the photosensitive substrate from an oblique direction with respect to the surface, an optical shaper for shaping the profile of the detection light into a slit-like shape to generate a slit beam, and an alteration device for changing the width of the slit beam by controlling the optical shaper. A controlled oscillation mirror guides the slit beam onto the surface of the photosensitive substrate and oscillates the reflected slit beam along the width direction of the slit to generate an oscillating slit beam. The exposure apparatus also includes a detector for detecting the surface height of the photosensitive substrate based on the oscillating slit beam, and a driving device for driving the photosensitive substrate along the optical axis of the projection optical system based on the detection result of the detector so that the surface of the photosensitive substrate comes into alignment with the focusing position of the exposure light beam.

The width of the slit beam is preferably adjusted according to the thickness of the photosensitive substrate. The alteration device may be adapted to increase the width of the slit beam when roughly detecting the height of the photosensitive substrate and decrease the width of the slit beam when precisely detecting the height of the photosensitive substrate.

In operation, for example, after a photosensitive substrate is loaded on a stage and AF sensors are calibrated, information about the thickness, material, and the like of the photosensitive substrate is supplied. Based on the information, an appropriate width of the slit beam is calculated. The appropriate width is a width such that a reflected light beam from the surface of the substrate can be sufficiently separated from a light beam reflected from the bottom of the substrate. If the substrate is thin, the width of the slit beam is decreased. If the substrate is thick, the width of the slit beam is increased. Although a narrow width of the slit beam makes the dynamic range of the detector narrower, the slit beam reflected by the top surface of the substrate can be reliably separated from the light beam reflected by the bottom of the substrate. In addition, measuring accuracy is improved. On the other hand, if the width of the slit beam is increased, the dynamic range of the detector and the detectable range are broadened.

If the top surface of the substrate is coated with a metal layer so that incident light does not reach the bottom face of the substrate, it is not necessary to consider separation of the incident light components between a light beam reflected by the top surface and one reflected from the bottom face of the substrate. In this case, the width of the slit beam can be increased regardless of the thickness of the substrate to avoid unreasonably narrowing the detectable range for the surface height of the substrate. With the structure according to the invention, even the first substrate in a lot, which has a relatively large loading error, can be reliably detected.

An appropriate amplitude (oscillating amount) of the slit beam is determined based on the width of the slit beam, which is determined in the above-mentioned manner. The amplitude of the slit beam is adjusted by controlling, for example, a mirror that reflects the slit beam. It is preferable to set the amplitude of the slit beam to about double the width of the slit beam itself.

BRIEF DESCRIPTION OF THE DRAWINGS

These and other aspects and advantages of the present invention will be described in detail with reference to the accompanying drawings, in which:

FIGS. 4(A) and 4(B) illustrate profiles of slit beams SL, in which FIG. 4(A) shows a slit beam with a relatively narrow width, and FIG. 4(B) shows a slit beam with a relatively broad width;

DETAILED DESCRIPTION OF PREFERRED EMBODIMENTS

Preferred embodiments of the invention will be described in which the invention is applied to a projection exposure apparatus used for manufacturing a liquid crystal display device. Those of ordinary skill in the art will contemplate alternate applications embodying the principles according to the invention, and the invention is not meant to be limited to the described application.

Figure 1:
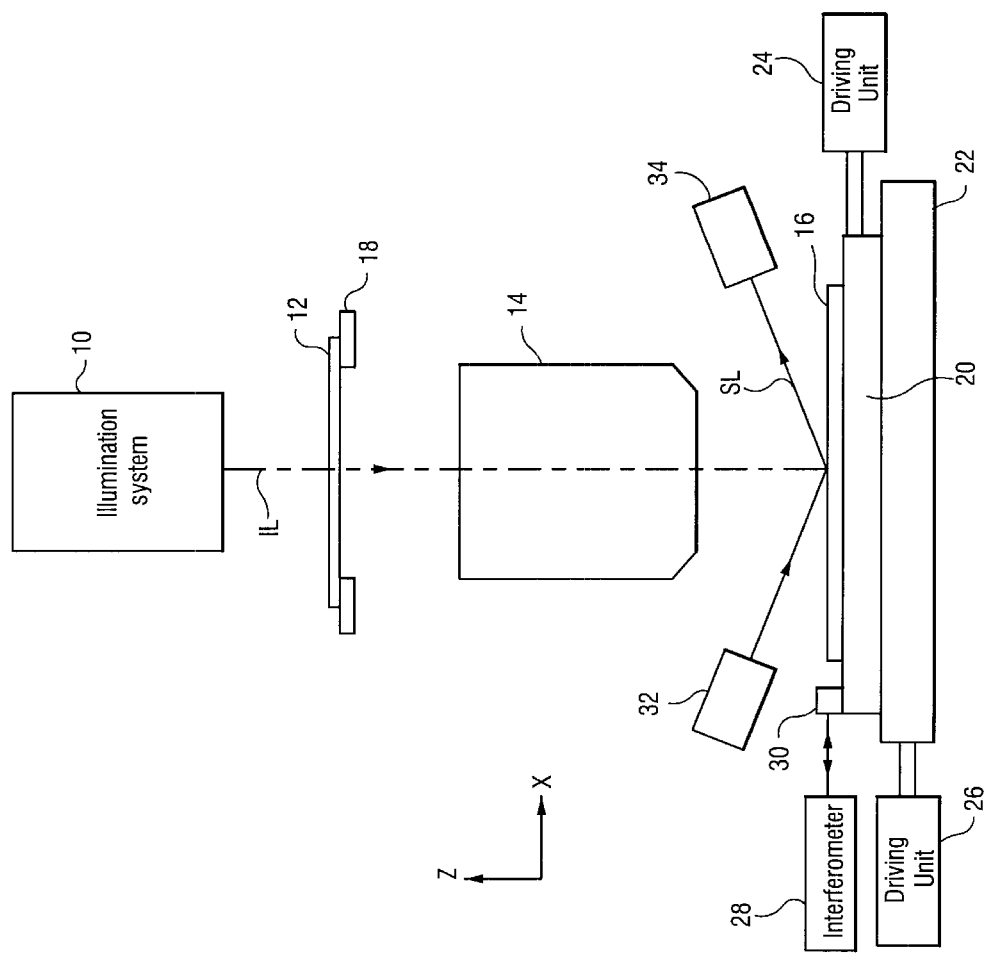
FIG. 1 is a front view of a projection exposure apparatus according to an embodiment of the invention.

FIG. 1 schematically illustrates a projection exposure apparatus according to one embodiment of the invention. An illumination system 10 emits illumination light IL to illuminate a reticle 12. A pattern formed on the reticle 12 is exposed and transferred through a projection optical system 14 onto a glass plate (substrate) 16. The illumination light IL emitted from the illumination system 10 is shaped in accordance with the pattern formed on the reticle 12. At the same time, the illumination light IL is adjusted so as to have a uniform illuminance distribution. The glass plate 16 is coated with photoresist, which has photosensitivity to the illumination light IL emitted from the illumination system 10.

The reticle 12 is fixed to the reticle stage 18 through vacuum adsorption. The glass plate 16 is loaded on an XY stage 22 through a Z-leveling stage 20. A Z-stage driving unit 24, which includes a motor, drives the Z-leveling stage 20 to adjust the position of the glass plate 16 in both the leveling direction and the optical-axis direction (Z direction) of the projection optical system 14 so that the surface of the glass plate 16 is in focus relative to the optical projection system 14. An XY-stage driving unit 26 drives the XY stage 22 so that the position of the glass plate 16 is adjusted within an XY plane, which is perpendicular to the optical axis of the projection optical system. A pair of moving mirrors 30 are fixed onto the Z-leveling stage 16, one being fixed along a side extending in the X direction, and the other being fixed along a side extending in the Y direction. A pair of laser interferometers 28 are provided corresponding to the respective moving mirrors 30. Each of the laser interferometers 28 emits a laser beam toward one of the moving mirrors 30, which then reflects the light beam back to the interferometer 28. The interferometers 28 thus detect the position of the Z-leveling stage 20, and therefore, the position of the glass plate 16 within the XY plane. Although FIG. 1 shows only an X-direction interferometer 28 and moving mirror 30, a Y-direction interferometer 28 and moving mirror 30 are also provided.

An AF (auto-focus) sensor system (32, 34) is positioned obliquely below the projection optical system 14 to measure the height (Z position) of the top surface of the glass plate 16. The AF sensor system comprises a light-transmitting sensor 32 for emitting a slit beam SL toward the surface of the glass plate 16, and a light-receiving sensor 34 for receiving the slit beam SL reflected from the surface of the glass plate 16. The light-receiving sensor 34 converts the received slit beam SL into an electric signal to detect the height of the top surface of the glass plate 16.

Figure 2:
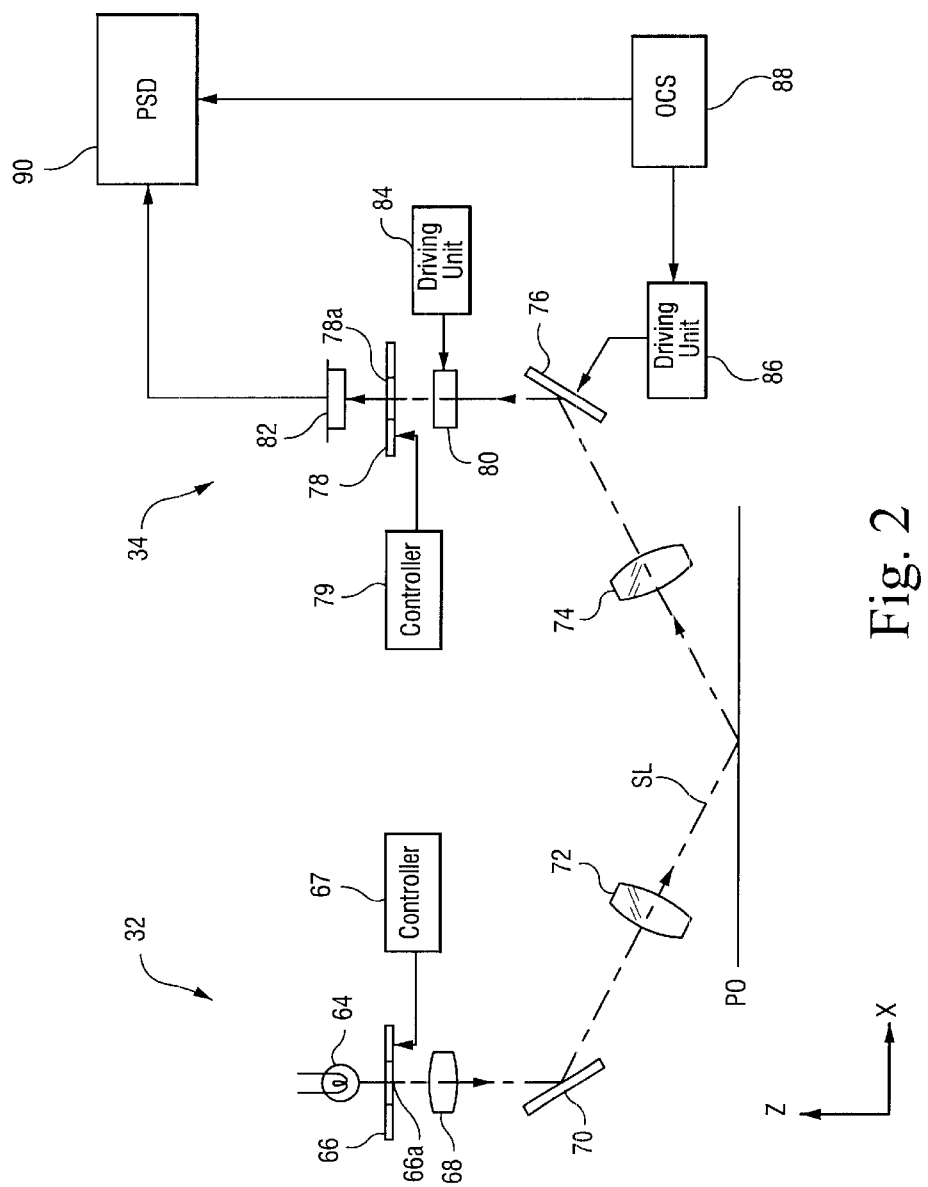
FIG. 2 is a schematic diagram showing the structure of the AF sensor system used in the projection exposure apparatus of FIG. 1.

FIG. 2 illustrates the detailed structure of the AF sensor system (32, 34). The light-transmitting sensor 32 includes a light source 64 that emits a light beam (e.g., infrared ray) having a wavelength that does not expose the photoresist applied to the surface of the glass plate 16. The light-transmitting sensor 32 also includes a slit plate 66 positioned in the optical path of the light beam emitted from the light source 64. When the light beam passes through the slit plate 66, the profile of the light beam is shaped, and a slit beam SL is output. The slit beam SL further passes through a lens 68 and is reflected by a mirror 70. The reflected slit beam SL enters a lens 72 and is focused onto an image-forming plane PO of the projection optical system 14.

The slit plate 66 consists of a liquid crystal device, which has a slit-like transparent area 66a in the center. Only the slit-like transparent area 66a allows the light beam to pass through. The size and shape of the slit-like transparent area 66a are controlled by a liquid crystal controller 67. Voltage is supplied selectively such that no voltage is applied to those liquid cell electrodes that correspond to the slit-like area 66a, while a voltage is applied to liquid cell electrodes of the remaining area. In this situation, only the slit-like area 66a becomes transparent, and the remaining area becomes dark to block the light beam. Using a liquid crystal device as the slit plate 66 is advantageous because the profile of the light beam can be set to a desired shape simply by controlling the voltage. The slit plate 66 may alternatively have a mechanical structure as long as the width of the slit is variable. For example, the slit plate 66 may be composed of two blades that are driven by, for example, a motor.

The slit beam SL reflected from the surface of the glass plate 16 is received by the light-receiving sensor 34. The reflected light beam SL first enters a lens 74 of the light-receiving sensor 34. An oscillation mirror 76 reflects the light beam that has passed through the lens 74. The oscillation mirror can change the reflecting direction by changing the oscillation. A slit plate 78 is provided in an image-forming plane of the lens 74. A parallel plate glass 80 is positioned between the oscillation mirror 76 and the slit plate 78. The light beam that has passed through the slit plate 78 is received by a light-receiving element 82.

The slit plate 78 has a slit-like transparent area 78a in the center to allow the slit beam SL to pass through. Similar to the slit plate 66 of the light-transmitting sensor 32, the slit plate 78 preferably consists of a liquid crystal device, and the size and shape of the transparent area 78a are controlled by a liquid crystal controller 79.

The parallel plate glass 80 is provided to shift the optical axis of the incident light flux and has its rotation axis in the direction perpendicular to the figure (paper), and swings within a given angle by means of a driving force supplied from a parallel plate driving unit 84. The inclination (swing) angle of the parallel plate glass 80 is adjusted to shift the image-forming position of a slit image of the lens 74 in the direction perpendicular to the image-forming plane PO. In the example shown in FIG. 2, the image-forming plane PO is coincident with the top surface of the glass plate 16.

The oscillation mirror 76 has its rotation axis in the direction perpendicular to the figure (paper), and oscillates in simple harmonic motion with a constant angular frequency and amplitude. The oscillation mirror 76 is driven by a driving unit 86, which is controlled by a driving signal from the oscillator (OCS) 88. The light-receiving element 82 converts the slit beam SL into an electric signal and supplies the electric signal to a phase synchronous demodulator (PSD) 90. The oscillator (OCS) 88 supplies an alternating signal, which has the same phase as the driving signal supplied to the driving unit 86, to the phase synchronous demodulator (PSD) 90, which synchronously rectifies using the phase of the alternating signal as a reference phase. A demodulation signal (focusing signal) output from the PSD 90 is called an S-curve signal and has a zero level when the center of the slit in the slit plate 78 is aligned with the oscillation center of the slit image reflected from the glass plate 16.

In the AF sensor system (32, 34), the slit beam SL that has passed through the slit plate 66 (transparent area 66a) of the light-transmitting sensor 32 forms a slit image on the surface of the glass plate 16 first; then, the slit beam SL passes through the lens 74 of the light-receiving sensor 34 and again forms an image on the slit plate 78. The slit image formed on the slit plate 78 is oscillated with a constant amplitude by the oscillation mirror 76. If the surface of the glass plate 16 is offset from the image-forming plane PO of the projection optical system 14, the oscillation center of the slit image shifts to the right or left of the slit in the slit plate 78. When the top surface of the glass plate 16 is located above the image-forming plane PO, the demodulation signal from the PSD 90 has a positive level. When the top surface of the glass plate 16 is positioned below the image-forming plane PO, then the demodulation signal has a negative level.

Figure 3:
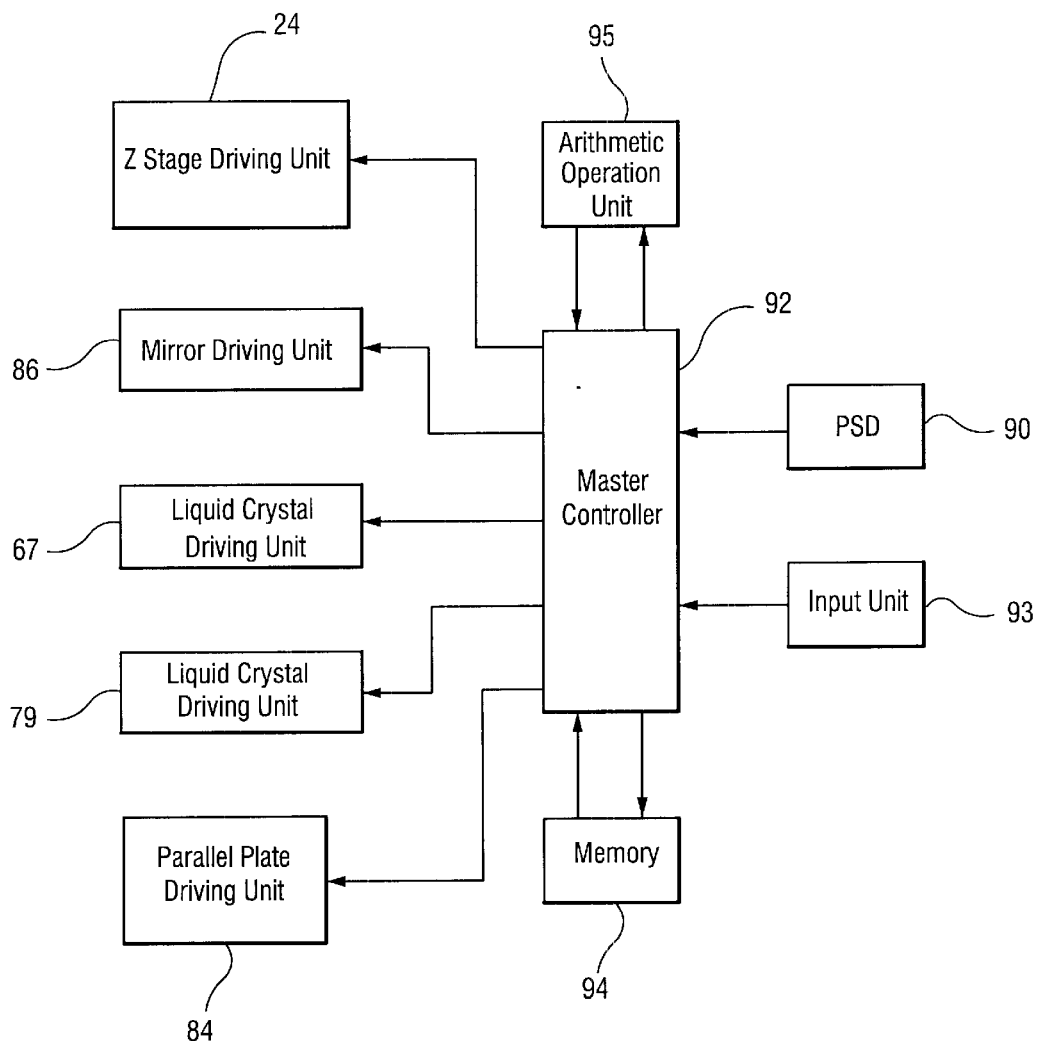
FIG. 3 is a block diagram showing the structure of the master control system used in the projection exposure apparatus of FIG. 1.

FIG. 3 shows the structure of the auto-focus control system. The master controller 92 comprehensively controls the elements in the auto-focus control system and receives a focusing signal from the AF sensor system (32, 34) and glass plate information from the input unit 93. The glass plate information includes, for example, the thickness and the material of the glass plate 16, which information may be read out from the data stored by the exposure apparatus itself, or from the recipe (process data from the previous process) of the glass plate 16. The output side of the master controller 92 is connected to the Z-stage driving unit 24 for driving the Z-leveling stage 20, the parallel plate driving unit 84 for driving the parallel plate glass 80, the mirror driving unit 86 for driving the oscillation mirror 76, and the liquid crystal controllers 67 and 79 for controlling the slit-like transparent areas 66a and 78a of the slit plates 66 and 78, respectively. A memory 94 and an arithmetic operation unit 95 are also connected to the master controller 92.

The master controller 92 controls the Z-stage driving unit 24 based on the focusing signal (synchronous demodulation signal) supplied from the PSD 90, thereby regulating the Z position of the glass plate 16. The master controller 92 also controls the parallel plate driving unit 84 to adjust the inclination angle of the parallel plate glass 80. The master controller further controls the liquid crystal controllers 67 and 79 based on the glass plate information (the thickness and the material) supplied from the input unit 93 to set the width of the slit-like transparent areas 66a and 78a of the slit plates 66 and 78. At the same time, the master controller controls the mirror driving unit 84 to regulate the oscillation of the oscillation mirror 76, thereby adjusting the amplitude of the slit beam SL.

In the operation of the exposure apparatus, the glass plate 16, which is to be exposed, is loaded on the Z-leveling stage 20, and calibration of the AF sensor system (32, 34) is performed. More specifically, the master controller 92 controls the Z-stage driving unit 24 to bring a measurement point of the first exposure area of the glass plate 16 into the image-forming plane PO of the projection optical system 14. Then, the master controller 92 activates the AF sensor system (32, 34) and adjusts the inclination angle of the parallel plate glass 80 through the driving unit 84 so that the light beam reflected from the exposure area of the glass plate 16 strikes the oscillation center of the slit-like transparent area 78a of the light-receiving slit plate 78. In other words, the master controller 92 controls the inclination angle of the parallel plate glass 80 so that the level of the focusing signal output from the PSD becomes zero. When the exposure area on the glass plate 16 is correctly positioned on the optical axis of the projection optical system 14 within the image-forming plane PO, an output signal of zero level is supplied to the master controller 92 from the PSD 90.

When the glass plate information including the thickness and the material of the glass plate 16 is supplied to the master controller 92 from the input unit 93, the information is temporarily held in the memory 94 and then supplied to the arithmetic operation unit 95. The arithmetic operation unit 95 determines the optimum width of the slit beam SL based on the thickness and the material of the glass plate 16. That is, the arithmetic operation unit 95 calculates the optimum width of the slit-like transparent areas 66a and 78a of the slit plates 66 and 78, such that the slit beam SL reflected from the top surface of the glass plate 16 is sufficiently separated from the slit beam component reflected from the bottom of the glass plate 16.

Figure 4A:
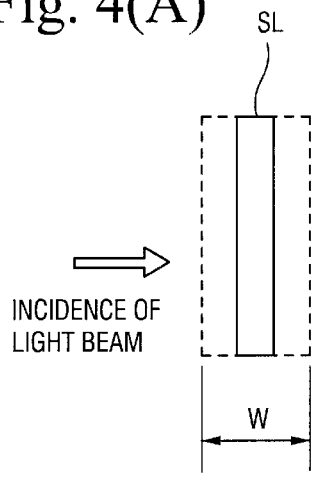
Figure 4B:
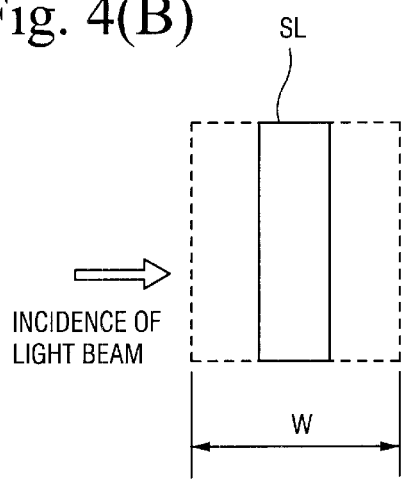

If the glass plate 16 is relatively thin, the widths of the slit-like transparent areas 66a and 78a are narrowed to decrease the width of the slit beam SL. If the glass plate 16 is relatively thick, then the widths of the slit-like transparent areas 66a and 78a are broadened to increase the width of the slit beam SL. With reference to FIGS. 4(A) and 4(B), narrowing and broadening the width of the slit beam are effected substantially along the light path or substantially parallel to the direction of incidence of the slit beam SL.

Figure 5A:
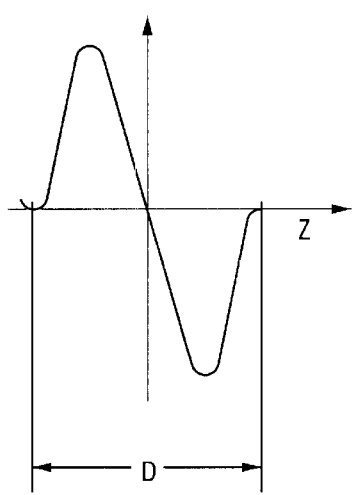
FIGS. 5(A) and 5(B) illustrate waveforms of focusing signals output from the phase synchronous detector, in which FIG. 5(A) corresponds to FIG. 4(A) and represents a signal waveform obtained when decreasing the width of the slit beam, and FIG. 5(B) corresponds to FIG. 4(B) and represents a signal waveform obtained when increasing the width of the slit beam.
Figure 5B:
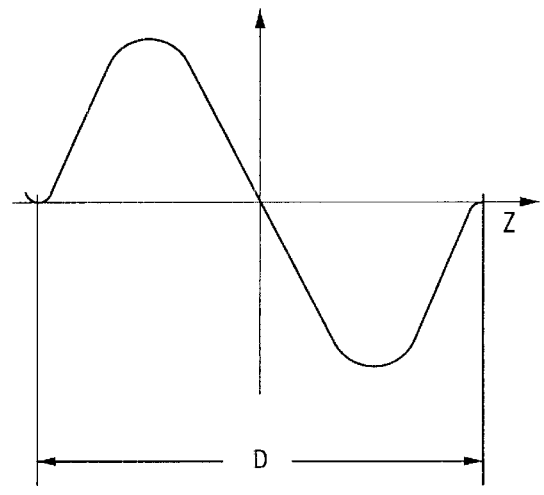
Figure 6:
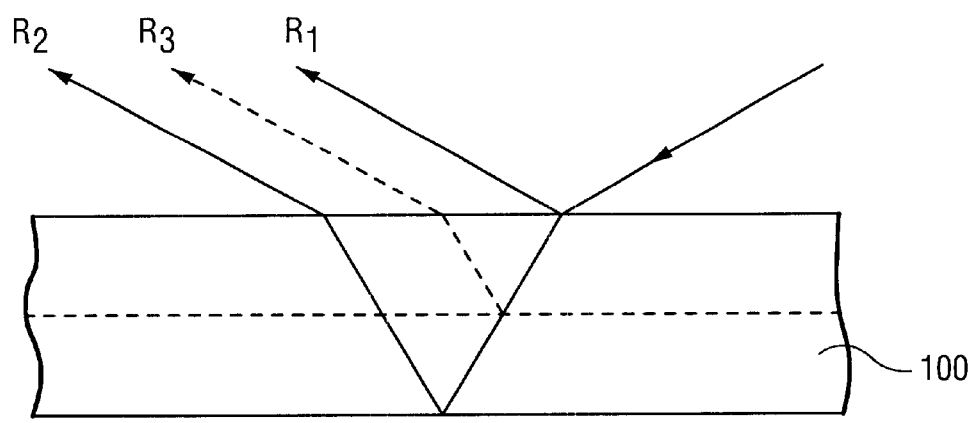
FIG. 6 illustrates the reflecting state of incident light onto a glass plate.

The arithmetic operation unit 95 also determines the optimum amplitude (oscillating amount) of the slit beam SL based on the calculated width of the slit-like transparent areas 66a and 78a. More specifically, the amplitude of the slit beam SL is set to about double the width of the slit beam SL itself. The master controller 92 controls the gain of the driving amplifier for the oscillator (not shown) within the driving unit 86, based on the determined amplitude, to regulate the amplitude of the slit beam SL. FIGS. 4(A) and 4(B) show profiles of the slit beams SL and the corresponding amplitudes, where the width of the slit beam SL is set narrow in FIG. 4(A), while the width of the slit beam SL is set broad in FIG. 4(B). FIGS. 5(A) and 5(B) correspond to FIGS. 4(A) and 4(B) and show the waveforms of the focusing signals output from the PSD 90 with the narrow width of the slit beam SL and the broad width of the slit beam SL, respectively. As is clear from the figures, when the width of the slit beam SL is narrowed, the dynamic range D becomes narrow (FIG. 5(A)), and the detectable range of the surface height of the glass plate 16 is limited, though a narrow width has an advantage that the light beam reflected from the top surface of the glass plate 16 is reliably separated from the light beam reflected from the bottom of the glass plate 16. When the width of the slit beam SL is increased, the dynamic range D is broadened (FIG. 5(B)), and the surface height detectable range is also broadened.

If a glass plate 16 is coated with a metal layer, then the incident light beam does not reach the bottom face, and separation of the reflected light components does not have to be considered. In this case, the width of the slit beam SL is set as broad as possible within a range that can ensure reliable detection of the reflected light beam from the top surface of the glass plate 16, so that the surface height of the glass plate 16 can be detected in a wide range.

When the width and the amplitude of the slit beam SL have been regulated, the master controller 92 drives the XY stage 22 through the XY-stage driving unit 26 to bring the exposure area of the glass plate 16 into an image-forming position. At the same time, the master controller 92 drives the Z-leveling stage 20 through the Z-stage driving unit 24 to adjust the Z position of the glass plate 16. Then, the master controller 92 turns on the trigger of an exposure shot to start exposure. In this manner, a plurality of shot areas (exposure areas) on the glass plate 16 are successively exposed. For each shot, the Z position of the glass plate 16 is adjusted through the focusing control explained above so that the exposure area is correctly brought into the image-forming position of the projection optical system 14.

Figure 7:
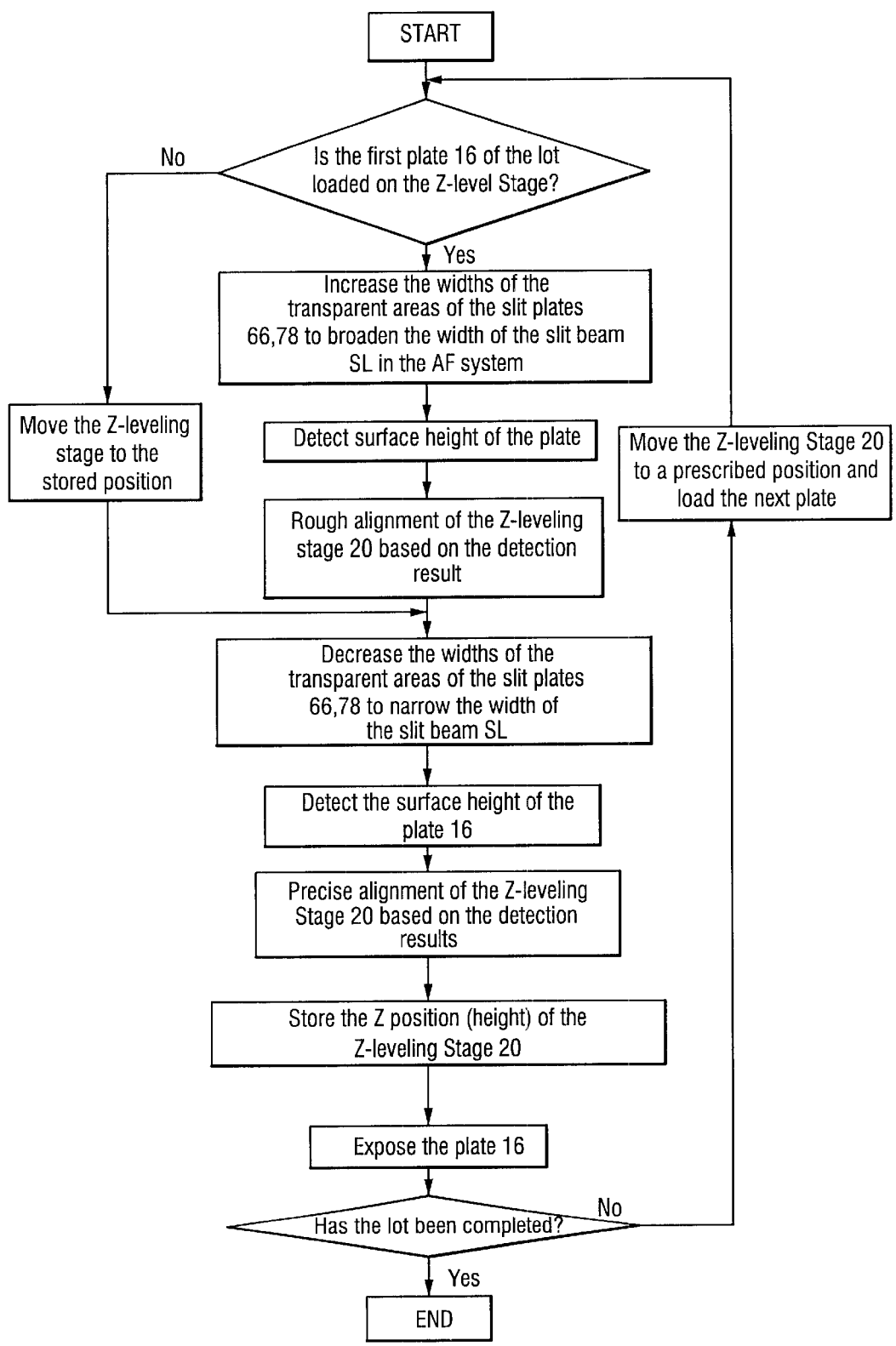
FIG. 7 is a flowchart showing the operation of a projection exposure apparatus according to another embodiment of the invention.

In the embodiment described above, the width of the slit beam SL is determined according to the thickness and the material of a glass plate 16 every time the glass plate 16 is loaded. However, the invention can be applied to the case in which one lot of glass plates (e.g., twenty five) are successively exposed. The operation of this example is shown in FIG. 7. The master controller 92 first determines if the first glass plate 16 is loaded on the Z-leveling stage 20. If the first glass plate 16 is loaded on the Z-leveling stage 20, the width of the transparent areas 66a and 78a of the slit plates 66 and 78 is increased to increase the width of the slit beam SL through the auto-focus operation, thereby broadening the detectable range of the surface height of the glass plate 16. If the detectable range is narrow in the very beginning, the Z position of the glass plate 16 may be out of the detectable range. To avoid such a situation, the width of the slit beam SL is set relatively broad. After the surface height of the glass plate 16 is detected, the Z-leveling stage 20 is moved along the optical-axis (Z direction) of the projection optical system 14 through rough auto-focusing.

Next, the widths of the transparent areas 66a and 78a are decreased to raise the measurement accuracy of the PSD 90. In this state, the surface height of the glass plate 16 is again measured. The Z-leveling stage 20 is moved along the optical axis of the projection optical system 14 based on the measured value for precise auto-focusing. When the glass plate 16 has been correctly positioned, the mask pattern is exposed onto the glass plate 16. At this time, the height of the Z-leveling stage 20 is stored. This information is used in positioning the next glass plate 16, thereby shortening the time required for positioning.

When exposure of the glass plate 16 has been completed, the glass plate 16 is unloaded from the Z-leveling stage 20, and the next glass plate is loaded on the Z-leveling stage. During this operation, the Z-leveling stage 20 moves to a predetermined place so that the loader/unloader (not shown) can easily hold the glass plate 16. The next glass plate 16 loaded on the Z-stage is immediately moved to the determined Z position, which was stored through the previous process, without performing rough alignment. Because errors (in, for example, thickness) among glass plates 16 are very small in the same lot, rough alignment can be omitted for the second and later glass plates 16 of the lot. Accordingly, the width of the slit beam SL is set narrow to precisely detect the surface height of the next glass plate 16. This method can shorten the detection process, and the throughput of the exposure apparatus is improved.

Although, in the embodiment, a glass plate is used in the exposure apparatus, the invention can be equally applied to the case in which an opaque semiconductor substrate is used.

In accordance with the present invention, because the width of the detection slit beam SL is adjusted according to the thickness and the material of the substrate 16, the slit beam reflected from the surface of the substrate 16 can be reliably detected without mixing with the beam component reflected from the bottom face of the substrate. Furthermore, the maximum dynamic range that is not affected by reflection from the bottom of the substrate is set so that the surface height of the substrate is detected without fail. Consequently, the time required for detecting the surface height of the substrate 16 is shortened.

While the invention has been described by way of example embodiments, it should be understood for those skilled in the art that the invention is not limited to the particulars disclosed. Various changes and substitutions may be made without departing from the spirit and the scope of the invention which is defined by the appended claims.

What is claimed is:

1. A surface position detection apparatus for detecting a surface position of a substrate, the apparatus comprising:
   an illumination device that emits detection light along a light path toward a substrate surface from an oblique direction with respect to the substrate surface;
   an optical shaper disposed in the light path downstream from the illumination device, the optical shaper shaping the detection light into a slit-like shape to generate a slit-like light beam;
   an alteration device communicating with the optical shaper and altering only a width of the slit-like light beam by controlling the optical shaper;
   an optical element disposed in the light path downstream from the optical shaper, the optical element guiding the slit-like light beam onto the substrate surface; and
   a detector disposed in the light path and receiving the slit-like light beam reflected from the substrate surface.

2. The surface position detection apparatus as claimed in claim 1, wherein the width of the slit-like light beam is determined such that the slit-like light beam reflected from the top surface of the substrate is separated from the slit-like light beam reflected from the bottom surface of the substrate.

3. The surface position detection apparatus as claimed in claim 1, further comprising:
   an oscillation controller that oscillates the slit-like light beam reflected from the substrate surface along the width direction of the slit-like light beam to generate an oscillating slit-like light beam; and
   an amplitude controller that controls the amplitude of the oscillation of the slit-like light beam oscillated by the oscillation controller according to the width of the slit-like light beam that has been altered by the alteration device, wherein the detector receives the oscillating slit-like light beam.

4. The surface position detection apparatus as claimed in claim 1, further comprising a memory connected to the alteration device, the memory supplying information including a thickness of the substrate to the alteration device, wherein the alteration device determines the width of the slit-like light beam according to the thickness of the substrate included in the information supplied from the memory.

5. The surface position detection apparatus as claimed in claim 4, wherein the alteration device increases the width of the slit-like light beam along the light path as the thickness of the substrate increases.

6. The surface position detection apparatus as claimed in claim 1, further comprising a controller connected to the alteration device, the controller having at least a first operating mode to detect the surface position of the substrate roughly and a second operating mode to detect the surface position of the substrate precisely, wherein the alteration device increases the width of the slit-like light beam when the controller selects the first operating mode, and decreases the width of the slit-like light beam when the controller selects the second operating mode.

7. The surface position detection apparatus as claimed in claim 1, further comprising a memory connected to the alteration device, the memory supplying information including a material of the substrate to the alteration device, wherein the alteration device determines the width of the slit-like light beam according to the material of the substrate included in the information supplied from the memory.

8. The surface position detection apparatus as claimed in claim 1, further comprising a slit plate positioned at an image-forming spot of the slit-like light beam reflected by the substrate surface, wherein the detector receives the slit-like light beam that has passed through the slit plate.

9. The surface position detection apparatus as claimed in claim 8, wherein the slit plate comprises a liquid crystal device having a slit-like transparent area in a center thereof, and wherein the apparatus further comprises a liquid crystal controller communicating with the liquid crystal device and controlling a voltage applied to liquid cell electrodes surrounding the slit-like transparent area.

10. The surface position detection apparatus as claimed in claim 1, wherein the optical shaper comprises a slit plate disposed in the light path adjacent the illumination device.

11. The surface position detection apparatus as claimed in claim 10, wherein the slit plate comprises a liquid crystal device having a slit-like transparent area in a center thereof, and wherein the alteration device comprises a liquid crystal controller communicating with the liquid crystal device and controlling a voltage applied to liquid cell electrodes surrounding the slit-like transparent area.

12. The surface position detection apparatus as claimed in claim 10, wherein the slit plate comprises a variable slit-like transparent area in a center thereof, the variable slit-like transparent area being controlled by the alteration device.

13. The surface position detection apparatus as claimed in claim 1, further comprising a movable plate glass disposed in the light path between the oscillation controller and the detector, the movable plate glass shifting an image-forming position of the oscillating slit-like light beam.

14. The surface position detection apparatus as claimed in claim 1, wherein the detector comprises:
   a light-receiving element receiving the oscillating slit-like light beam and converting the oscillating slit-like light beam into an electrical signal; and
   a phase synchronous demodulator (PSD) receiving the electrical signal from the light-receiving element.

15. An exposure apparatus comprising:
   an exposure light source that emits exposure light along an optical axis to a mask to illuminate a pattern formed on the mask;
   a projection optical system disposed along the optical axis and receiving the exposure light source, the projection optical system transferring an image of the pattern onto a surface of a photosensitive substrate;
   an illumination device that emits detection light along a light path toward the surface of the photosensitive substrate from an oblique direction with respect to the photosensitive substrate surface;

an optical shaper disposed in the light path downstream from the illumination device, the optical shaper shaping the detection light into a slit-like shape to generate a slit-like light beam;

an alteration device communicating with the optical shaper and altering only a width of the slit-like light beam by controlling the optical shaper;

an optical element disposed in the light path downstream form the optical shaper, the optical element guiding the slit-like light beam onto the surface of the photosensitive substrate;

a detector disposed in the light path and receiving the slit-like light beam reflected from the substrate surface; and a driving unit communicating with the detector and supporting the photosensitive substrate along the optical axis of the projection optical system based on the detecting result of the detector so that the surface of the photosensitive substrate comes into alignment with a focusing position of the exposure light.

16. The exposure apparatus as claimed in claim 15, wherein the width of the slit-like light beam is determined such that the slit-like light beam reflected from the top surface of the photosensitive substrate is separated from the slit-like light beam reflected from the bottom surface of the photosensitive substrate.

17. The exposure apparatus as claimed in claim 15, further comprising:

an oscillation controller that oscillates the slit-like light beam reflected from the surface of the photosensitive substrate along the width direction of the slit-like light beam to generate an oscillating slit-like light beam; and an amplitude controller that controls the amplitude of the oscillation of the slit-like light beam oscillated by the oscillation controller according to the width of the slit-like light beam that has been altered by the alteration device, wherein the detector receives the oscillating slit-like light beam.

18. The exposure apparatus as claimed in claim 15, further comprising a memory connected to the alteration device, the memory storing information relating to the photosensitive substrate.

19. The exposure apparatus as claimed in claim 18, wherein the information comprises at least one of a thickness of the photosensitive substrate and a material of the substrate, and the alteration device determines the width of the slit-like light beam according to at least one of the thickness and the material comprised in the information of the memory.

20. The exposure apparatus as claimed in claim 15, further comprising a master controller connected to the alteration device, the master controller having at least a first operating mode to detect the surface position of the photosensitive substrate roughly and a second operating mode to detect the surface position of the photosensitive substrate precisely, wherein the alteration device increases the width of the slit-like light beam when the master controller selects the first operating mode, and decreases the width of the slit-like light beam when the master controller selects the second operating mode.

21. The exposure apparatus as claimed in claim 15, further comprising:

a master controller connected to the alteration device, the master controller controlling the alteration device; and an arithmetic operation unit connected to the master controller, the arithmetic operation unit determining an optimum width of the slit-like light beam based on the thickness and material of the photosensitive substrate.

22. The exposure apparatus as claimed in claim 15, wherein the arithmetic operation unit determines an optimum amplitude of the oscillation of the slit-like light beam oscillated by the oscillation controller based on the width of the slit-like light beam, and the master controller controls the oscillation controller based on the optimum amplitude of the oscillation.

23. The exposure apparatus as claimed in claim 15, wherein the detector comprises:

a light-receiving element receiving the oscillating slit-like light beam and converting the oscillating slit-like light beam into an electrical signal; and a phase synchronous demodulator (PSD) receiving the electrical signal from the light-receiving element.

24. The exposure apparatus as claimed in claim 23, wherein the PSD outputs the offset signal that shows a distance between the surface of the photosensitive substrate and an image-forming plane of the projection optical system, and the master controller controls the driving unit based on the offset signal.

25. An auto focus (AF) sensor system for determining a surface position of a substrate, the AF sensor system comprising:

a light-transmitting device that emits detection light along a light path toward a surface of the substrate from an oblique direction with respect to the surface, the light-transmitting device including structure that shapes the detection light into a slit-like light beam;

a light receiving device disposed in the light path and receiving the slit-like light beam;

a memory having information that includes at least one of a thickness and a material of the substrate; and a controller communicating with the light-transmitting device, the light receiving device, and the memory, the controller controlling a width of the slit-like light beam in accordance with the thickness and the material of the substrate.

26. The AF sensor system as claimed in claim 25, wherein the width of the slit-like light beam is determinded such that the slit-like light beam reflected from the top surface of the substrate is separated from the slit-like light beam reflected from the bottom surface of the substrate.

27. The AF sensor system as claimed in claim 25, wherein the light receiving device comprises an oscillating device that oscillates the slit-like beam, and the controller controls the amplitude of the oscillation of the slit-like beam via the oscillating device.

28. The AF sensor system as claimed in claim 25, wherein the structure that shapes the detection light comprises a slit plate disposed in the light path.

29. The AF sensor system as claimed in claim 28, wherein the slit plate comprises a liquid crystal device having a slit-like transparent area in a center thereof, and wherein the controller comprises a liquid crystal controller communicating with the liquid crystal device and controlling a voltage applied to liquid cell electrodes surrounding the slit-like transparent area.

30. The AF sensor system as claimed in claim 28, wherein the slit plate comprises a variable slit-like transparent area in a center thereof, the variable slit-like transparent area being controlled by the controller based on a desired width of the slit-like light beam determined by the controller utilizing the information of the memory.

31. An exposure method utilizing an exposure apparatus including an auto focus AF) sensor system, an exposure light source for emitting exposure light along an optical axis to a mask to illuminate a pattern formed on the mask, and a projection optical system disposed along the optical axis and receiving the exposure light from the exposure light source, the projection optical system transferring an image of the pattern onto a surface of a substrate, the method comprising:

(a) determining an optimum width of a detection light beam according to at least one of a thickness and a material of the substrate;

(b) emitting the detection light beam along a light path toward the surface of the substrate from an oblique direction with respect to the surface;

(c) receiving the detection light beam reflected from the surface of the substrate and calculating a surface position of the substrate; and (d) controlling a position of the substrate with respect to the direction substantially parallel to the optical axis according to the surface position of the substrate.

32. The exposure method as claimed in claim 31, wherein the width of the detection light beam is determined such that the detection light beam reflected from the top surface of the substrate is separated from the detection light beam reflected from the bottom surface of the substrate.

33. The exposure method as claimed in claim 31, further comprising after step (d) the step of triggering an exposure shot from the exposure light source to expose the substrate.

34. The exposure method as claimed in claim 25, further comprising prior to step (a) the step of (e) calibrating the AF sensor system.

35. The exposure method as claimed in claim 34, further comprising after step (b) the steps of shaping the detection light beam into a slit-like light beam and (f) controlling a width of the slit-like light beam according to the optimum width that is set based on at least one of the thickness and the material of the substrate.

36. The exposure method as claimed in claim 35, wherein step (e) is practiced by (e1) broadening the width of the slit-like light beam to a width wider than the optimum width, (e2) calculating a first surface position of the substrate by utilizing the slit-like light beam with the width wider than the optimum width, and (e3) positioning the substrate according to the first surface position.

37. The exposure method as claimed in claim 36, further comprising after steps (e1)–(e3) the step of narrowing the width of the slit-like light beam to the optimum width and performing steps (b)–(d).

38. The exposure method as claimed in claim 37, further comprising after step (e) the step of (f) triggering an exposure shot from the exposure light source to expose the substrate.

39. The exposure method as claimed in claim 38, further comprising after step (f) the step of (g) replacing the substrate with a second substrate and positioning the second substrate in the first surface position.

40. The exposure method as claimed in claim 31, further comprising after step (b) the steps of (h) shaping the detection light beam into a slit-like light beam and (i) controlling a width of the slit-like light beam according to the optimum width that is set based on at least one of the thickness and the material of the substrate.

41. The exposure method as claimed in claim 40, further comprising (j) increasing the width of the slit-like light beam when positioning the substrate a first time and decreasing the width of the slit-like light beam when positioning the substrate after the first time.

42. The exposure method as claimed in claim 31, wherein step (a) is practiced by increasing the optimum width as the thickness of the substrate increases.

43. The exposure method as claimed in claim 31, further comprising after step (b) the step of (k) oscillating the detection light beam reflected from the surface of the substrate with a predetermined amplitude that is set according to the width of the detection light beam.

* * * * *